US008812254B2

(12) United States Patent
Sheikman et al.

(10) Patent No.: US 8,812,254 B2
(45) Date of Patent: Aug. 19, 2014

(54) METHODS AND SYSTEMS FOR MONITORING STATOR WINDING VIBRATION

(75) Inventors: Boris Leonid Sheikman, Minden, NV (US); Dwayne Andrew Folden, Gardnerville, NV (US); Samuel Thomas Walter Francis, Gardnerville, NV (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 12/388,088

(22) Filed: Feb. 18, 2009

(65) Prior Publication Data
US 2010/0211334 A1 Aug. 19, 2010

(51) Int. Cl.
*G01H 1/00* (2006.01)
*G01M 5/00* (2006.01)
*H02K 11/00* (2006.01)
*G01R 31/34* (2006.01)

(52) U.S. Cl.
CPC ........... *H02K 11/001* (2013.01); *G01M 5/0041* (2013.01); *G01M 5/0066* (2013.01); *G01R 31/343* (2013.01); *G01R 31/346* (2013.01); *G01M 5/0091* (2013.01)
USPC .......................................................... 702/56

(58) Field of Classification Search
USPC ............................................................ 702/57
See application file for complete search history.

(56) References Cited

U.S. PATENT DOCUMENTS

| 4,780,724 A | 10/1988 | Sharma |
| 5,252,927 A | 10/1993 | Bruhlmeier et al. |
| 5,389,876 A | 2/1995 | Hedengren |
| 5,659,248 A | 8/1997 | Hedengren |
| 5,801,530 A | 9/1998 | Crosby |
| 6,750,575 B2 | 6/2004 | Wright |
| 7,064,559 B2 | 6/2006 | Bissonnette |
| 7,167,129 B1 | 1/2007 | Strassner, II |
| 7,298,333 B2 | 11/2007 | Iluz |

(Continued)

FOREIGN PATENT DOCUMENTS

| CH | 646795 A5 | 12/1984 |
| EP | 0482229 A1 | 4/1992 |

(Continued)

OTHER PUBLICATIONS

M. Kurtz, Diagnostic Testing of Generator Insulation Without Service Interruption, Canadian General Electric Co, Ltd, 1980.*
European Search Report and Written Opinion, Jul. 1, 2010, from corresponding EP10152744.

*Primary Examiner* — Tung S Lau
(74) *Attorney, Agent, or Firm* — Cooper Legal Group, LLC

(57) ABSTRACT

Embodiments of methods and systems for monitoring stator winding vibration of a rotating electric machine are provided. According to one example embodiment, a system includes at least one sensor including at least one conductive sensor antenna deposited on a first side of at least one layer of a printed circuit board substrate and positioned to substantially face a stator winding, and a non-conductive shield mounted to an opposing side of the printed circuit board substrate and positioned to substantially face away from the stator winding. The system further includes an alternating current power source in communication with the sensor and operable to deliver current to the conductive sensor antenna. A signal processing unit may be in communication with the sensor, operable to measure a load on the sensor antenna and to transmit vibration data to a controller responsive to the load on the sensor antenna.

20 Claims, 5 Drawing Sheets

(56) References Cited

U.S. PATENT DOCUMENTS

| | | |
|---|---|---|
| 7,360,294 B2 | 4/2008 | LaClair |
| 2005/0061076 A1 | 3/2005 | Kim |
| 2006/0214849 A1 | 9/2006 | Fabrega-Sanchez et al. |
| 2008/0036336 A1 | 2/2008 | Salem |

FOREIGN PATENT DOCUMENTS

| | | |
|---|---|---|
| JP | 62104455 A | 5/1987 |
| JP | 1126570 A | 5/1989 |
| JP | 1191072 A | 8/1989 |
| JP | 2307345 A | 12/1990 |

* cited by examiner

METHODS AND SYSTEMS FOR MONITORING STATOR WINDING VIBRATION

FIELD OF THE INVENTION

The invention relates to rotating machinery, and more specifically relates to methods and systems for monitoring stator winding vibrations.

BACKGROUND OF THE INVENTION

Vibration analysis of electric rotating machines has been conducted for decades, but most of the standard methods have involved monitoring the external components of the machine to ascertain problems caused from internal movement in the machine. However, recent developments have seen proximity probes and accelerometers being used on internal components of the machine to measure the bearing and shaft vibration in electric rotating machines in an effort to monitor the mechanical condition of the machines. Although, most proximity probes in use provide static measurements when the electric rotating machine is not in operation; thus, requiring shut down to monitor of the machine condition.

In electric rotating machines the stator windings are insulated to prevent electrical discharge and for efficient machine operation. The stator winding insulation is exposed to harsh operating conditions, such as high temperatures for example. A slow but steady exposure to multiple stresses, such as voltage stress, mechanical forces, and thermal effects, during the operation of the machine bring about a change in the nature of the insulation. Degradation of the insulation brought about by these multiple stresses result in vibration of the stator windings, which in turn lead to further degradation of the stator windings. The vibration subsequently leads to increased partial electrical discharge in the stator windings and finally to machine failure. Without insulation, the conducting stator windings come in contact with each other or with the grounded stator core, causing the current to flow in undesired paths and thereby preventing the proper operation of the machine. Thus, it is imperative to detect such early vibrations during the operation of the machine and take corrective actions else degradation of the insulation may lead to irreversible damage.

Accordingly, there is need for methods and systems for monitoring stator winding vibrations, for example, to detect and dynamically monitor early vibrations during the operation of the electric rotating machine.

BRIEF DESCRIPTION OF THE INVENTION

Embodiments of the invention can address some or all of the needs described above. According to one embodiment of the invention, there is disclosed a system for monitoring a stator winding. The system includes at least one sensor which includes at least one conductive sensor antenna deposited on a first side of at least one layer of a printed circuit board substrate. At least a portion of the conductive sensor antenna is positioned to substantially face a stator winding. The sensor also includes a non-conductive shield mounted to an opposing side of the at least one layer of the printed circuit board substrate such that at least a portion of the non-conductive shield is positioned to substantially face away from the stator winding. The system further includes at least one alternating current power source in communication with the at least one sensor and operable to deliver current to the at least one conductive sensor antenna. Furthermore, at least one signal processing unit may be in communication with the at least one sensor, operable to measure a load on the at least one sensor antenna and transmit vibration data to a controller responsive to the load on the at least one sensor antenna.

According to another embodiment of the invention, there is disclosed an apparatus for monitoring a stator winding. The apparatus may include a printed circuit board substrate having a first side and an opposing side, where the first side may be positioned against a stator winding. The apparatus may also include at least one conductive sensor antenna deposited on the first side of the printed circuit board substrate. The apparatus may also have at least one electrical feed in electrical communication with the at least one conductive sensor antenna and may be operable to connect to a power source and a signal processing unit. Moreover, at least one non-conductive shield may be mounted to the opposing side of the printed circuit board substrate. The power source may be operable to deliver current through the at least one electrical feed to the at least one conductive sensor antenna. The signal processing unit connected to the at least one electrical feed may be operable to measure a load on the at least one conductive sensor antenna as it is affected by variations in an electromagnetic field caused by movement of the stator winding. The vibration data generated in the signal processing unit may be transmitted to a controller responsive to the load on the at least one sensor antenna.

According to yet another embodiment of the invention, there is disclosed a method for monitoring a stator winding. The method includes providing at least one sensor which includes at least one conductive sensor antenna substantially deposited on a first side of a printed circuit board substrate and a non-conductive shield mounted to an opposing side of the printed circuit board substrate. At least a portion of the at least one sensor may be positioned along a stator winding, where the first side of the printed circuit board substrate faces substantially towards the stator winding and the opposing side faces substantially away from the stator winding. The method may further include delivering alternating current from an alternating current power source to the at least one sensor antenna. The method may also include receiving a measurement of a load on the at least one sensor antenna by a signal processing unit, in which the load is affected by variations in an electromagnetic field caused by movement of the stator winding, and transmitting vibration data to a controller from the signal processing unit responsive to the load on the at least one sensor antenna.

Other embodiments, aspects, and features of the invention will become apparent to those skilled in the art from the following detailed description, the accompanying drawings, and the appended claims.

BRIEF DESCRIPTION OF THE DRAWINGS

Figure 1:
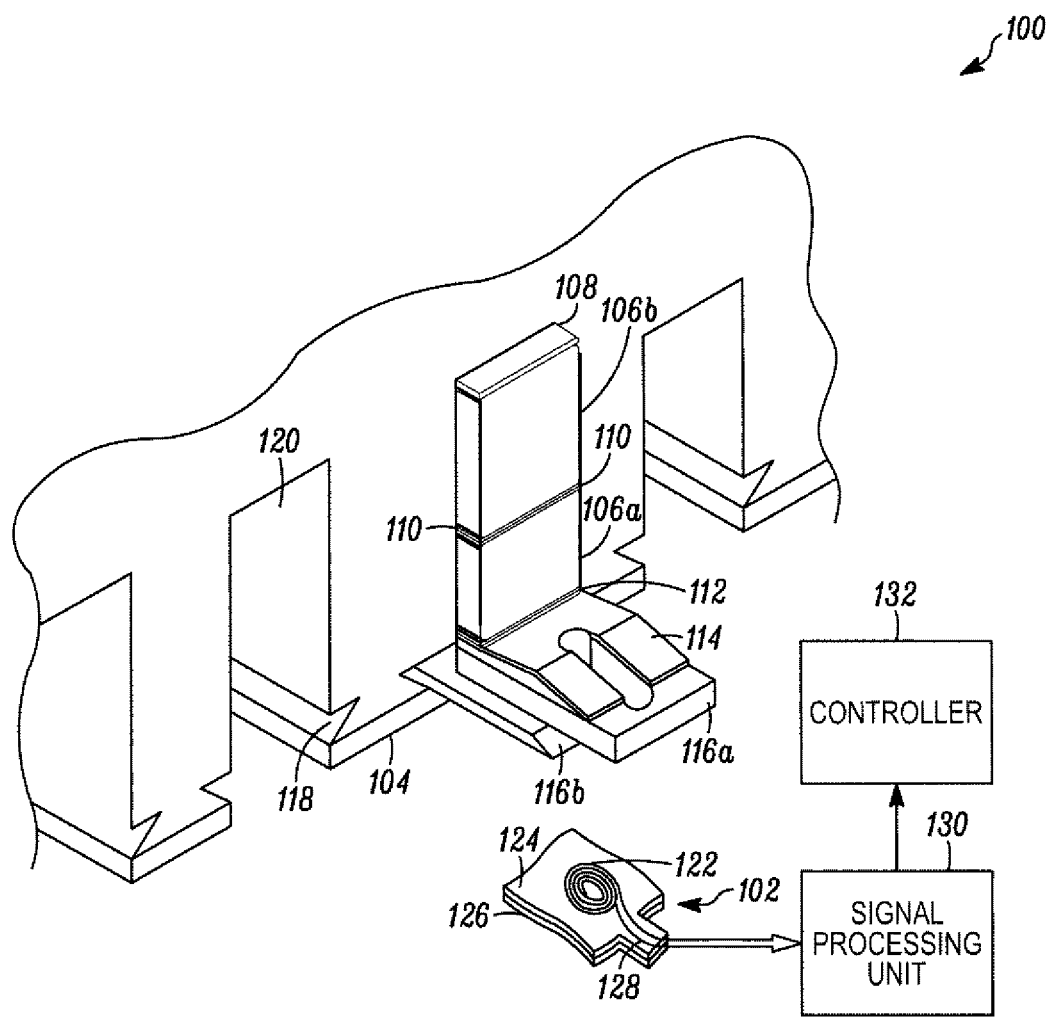

Having thus described the invention in general terms, reference will now be made to the accompanying drawings, which are not necessarily drawn to scale, and wherein:

FIG. 1 illustrates a partial view of an example stator winding monitoring system, in accordance with an embodiment of the invention.

Figure 2:
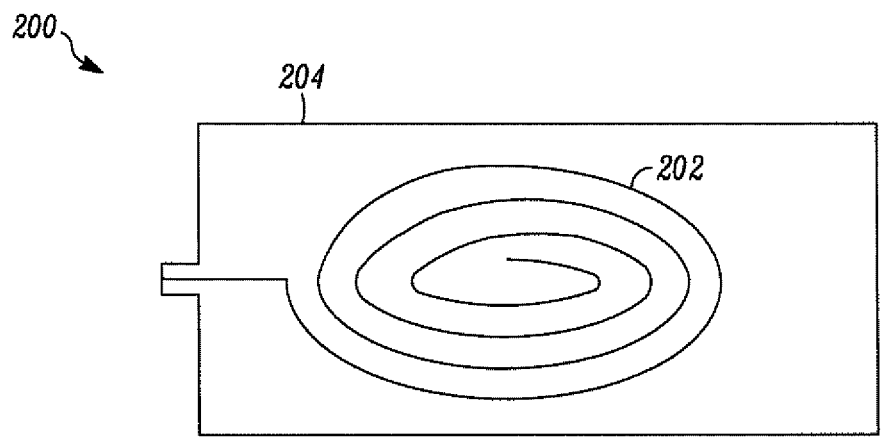

FIG. 2 illustrates an example sensor, in accordance with an embodiment of the invention.

Figure 3:
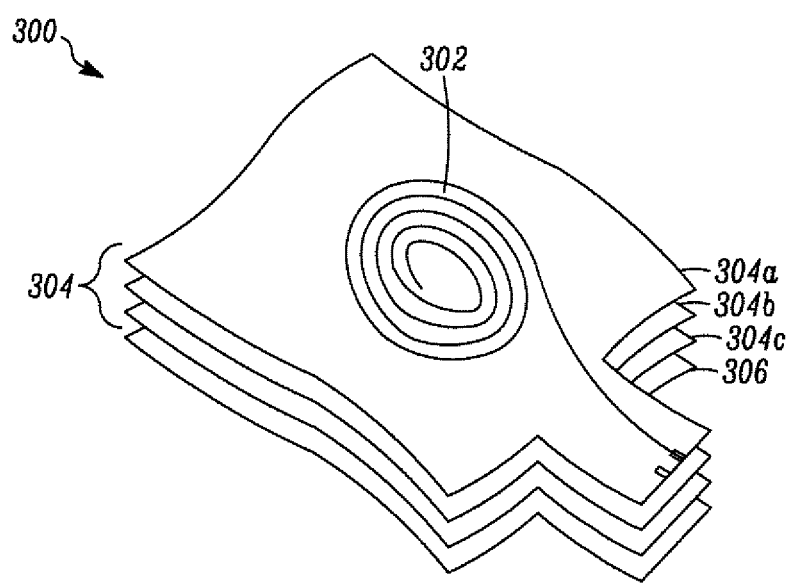

FIG. 3 illustrates an example sensor, in accordance with an embodiment of the invention.

Figure 4:
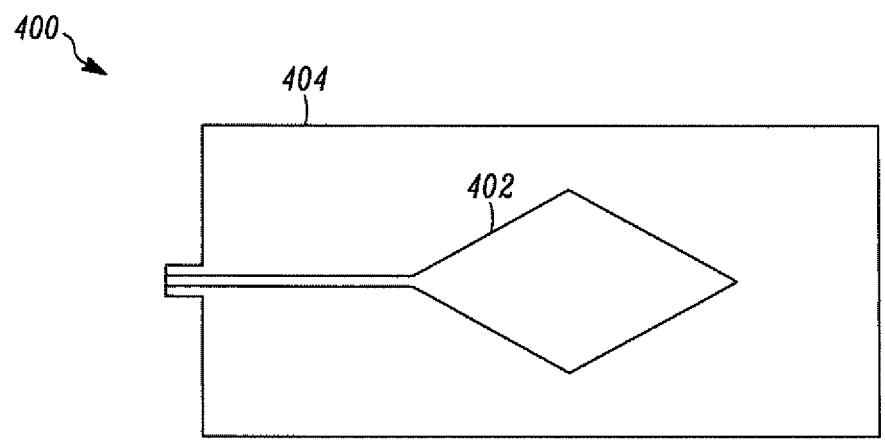

FIG. 4 illustrates an example sensor, in accordance with an embodiment of the invention.

Figure 5:
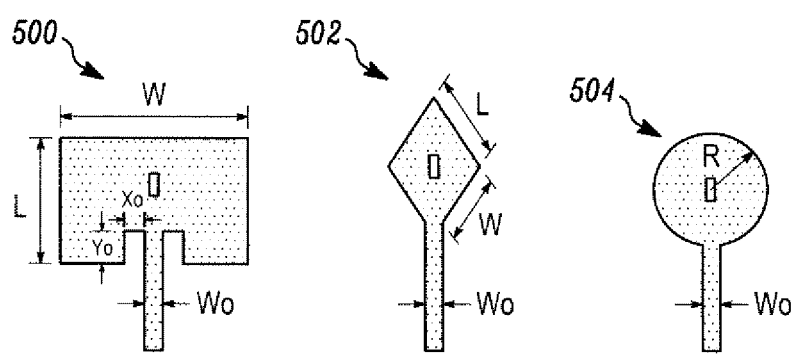

FIG. 5 illustrates example sensor antenna shapes, in accordance with embodiments of the invention.

Figure 6:
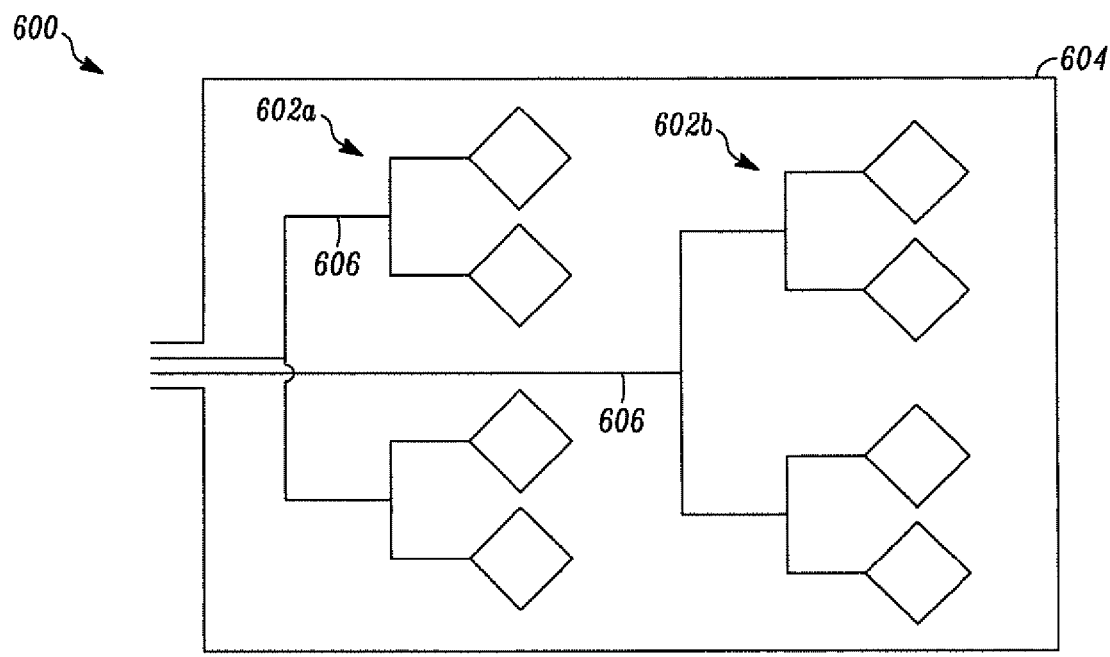

FIG. 6 illustrates an example sensor, in accordance with an embodiment of the invention.

Figure 7:
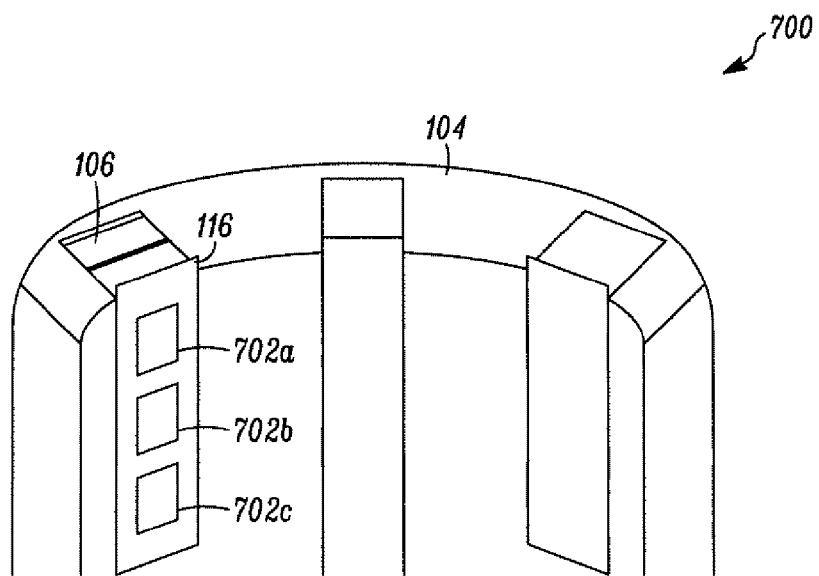

FIG. 7 illustrates a functional view of an example stator winding monitoring system, in accordance with an embodiment of the invention.

Figure 8:
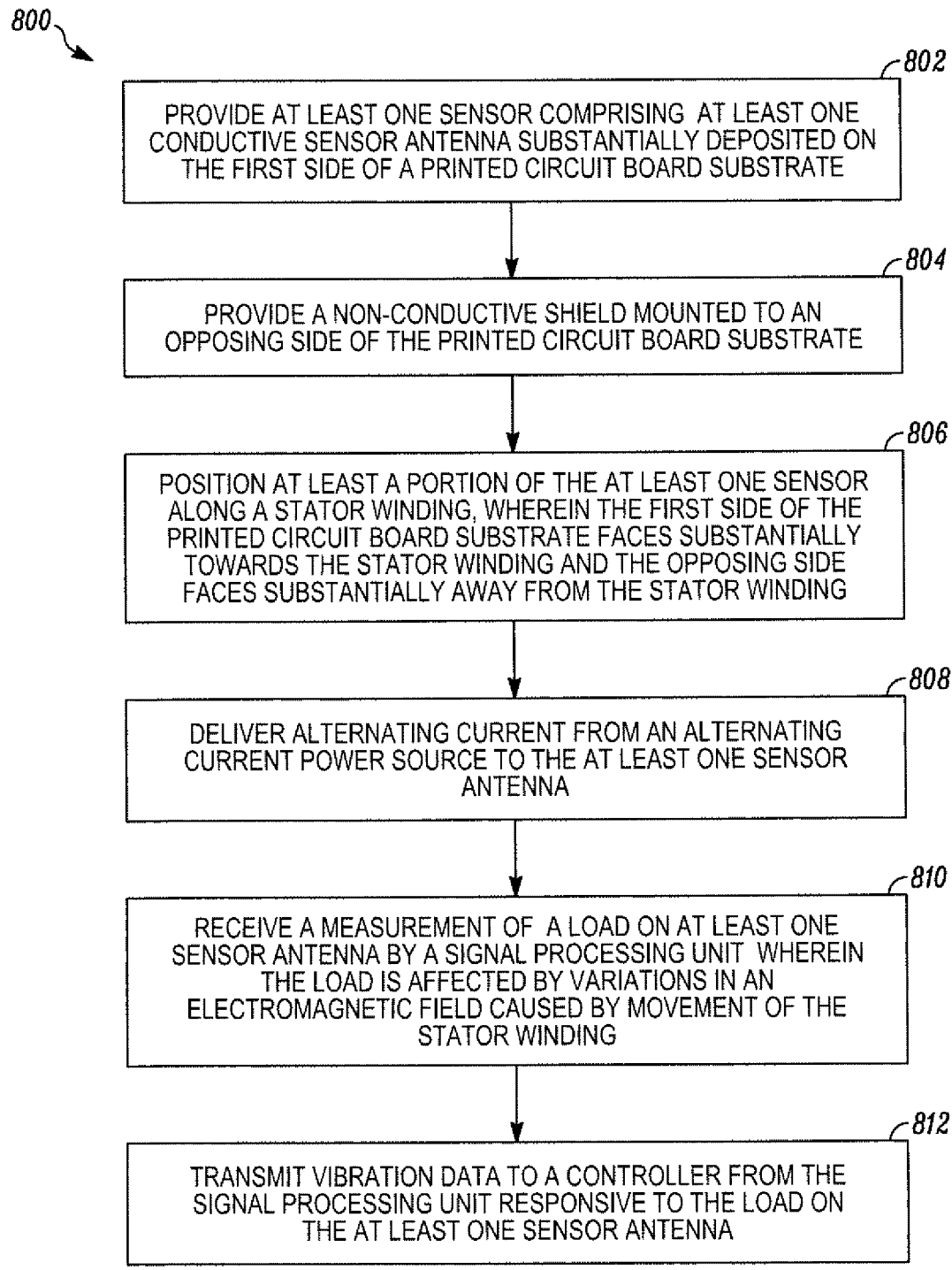

FIG. 8 illustrates a flowchart of an example method for monitoring stator winding vibration.

DETAILED DESCRIPTION OF THE INVENTION

Illustrative embodiments of the invention now will be described more fully hereinafter with reference to the accompanying drawings. Indeed, the invention may be embodied in many different forms and should not be construed as limited to the embodiments set forth herein; rather, these embodiments are provided so that this disclosure will satisfy applicable legal requirements. Like numbers refer to like elements throughout.

Disclosed are methods and systems for monitoring stator winding vibration. According to an embodiment of the invention, the system includes at least one sensor which further includes at least one conductive sensor antenna deposited on a first side of at least one layer of a printed circuit board substrate. At least a portion of the conductive sensor antenna is positioned to substantially face a stator winding. The sensor further includes a non-conductive shield mounted to an opposing side of the at least one layer of the printed circuit board substrate such that at least a portion of the non-conductive shield is positioned to substantially face away from the stator winding.

FIG. 1 illustrates a partial view of an example stator winding monitoring system 100 in accordance with an embodiment of the invention. FIG. 1 shows certain components of an example stator winding monitoring system 100, which includes a sensor 102 positioned near a stator core 104, an inner stator bar 106a and an outer stator bar 106b. A slot liner 108 may be placed between the stator core 104 and the outer stator bar 106b, and a slot filler 110 may be placed between the inner stator bar 106a and the outer stator bar 106b. A grooved slot filler 112 may be placed between the inner stator bar 106a and a ripple spring 114. Additionally, a slide wedge 116a and an end wedge 116b may be placed below the ripple spring 114 to keep the ripple spring 114 pressed against the inner stator bar 106a. For simplicity, the inner stator bar 106a and the outer stator bar 106b may be referred to as stator bars 106, and the slide wedge 116a and the end wedge 116b may be referred to as wedges 116. Moreover, the wedges 116 positioned below the ripple spring 114 may be slideably engaged in wedge shaped grooves 118 in the sidewalls of the stator core 104. In due course of sustained operation of the machine, the ripple spring 114 may fail to retain the stator bars 104 in the stator slots 120 thus allowing the stator bars 106 to vibrate. The ripple spring 114 in the process undergoes compression to accommodate the vibration of the stator bars 106. Thus if the vibration of the stator bars 106 is not detected early, it may result in erosion of the stator bar lamination thus leading to partial electric discharge. Therefore, the sensor 102 is positioned near the stator bars 106 to monitor such early vibration of the stator bars 106.

In an embodiment of the invention, the sensor 102 may comprise at least one conductive sensor antenna 122 on a first side of a printed circuit board substrate 124. The sensor antenna 122 creates a symmetrical electromagnetic field around the sensor 102. The sensor 102 may measure the vibration of the stator bars 106 by measuring variations in the electromagnetic field produced by the sensor antenna 122. In an embodiment of the invention, the sensor 102 may be placed against the wedges 116, and is thus positioned between the stator core 104 and rotor (not shown in figure). The positioning of the sensor 102 may be such that the first side of the printed circuit board substrate 124 containing the conductive sensor antenna 122 may, to a large extent, face the vibrating stator bars 106, while the opposing side of the printed circuit board substrate 124 may, to a large extent, face the rotor. However, as the electromagnetic field produced by the conductive sensor antenna 122 is symmetrically distributed about the sensor 102, variations in the electromagnetic field due to the proximity of the stator bars 106 as well as the rotor of the electric rotating machine during operation may be measured by the sensor 102. Thus in order to limit the effect of the rotor on the sensor 102, the opposing side of the printed circuit board substrate 124 may be mounted with a non-conductive shield 126. The conductive shield 126 may be formed from iron or ferrite or semi conductor materials, for example, silicon, germanium, and the like. In an embodiment of the invention, the printed circuit board substrate 124 may be a rigid printed circuit board substrate or a flexible printed circuit board substrate. The printed circuit board substrate 124 is made of insulating materials and generally may be formed of ceramics, plastics, and the like. Flexible printed circuit board substrates facilitate conforming to curved and non-flat surfaces. For example, sensors on flexible printed circuit boards may be attached to curved walls of a pipe, curved stator walls of a small engine, non flat surfaces of turbine or compressor blades, shafts etc. The thickness of the printed circuit board substrate 124 may be in the range of approximately 1 millimeter to approximately 100 millimeters. In one example embodiment, the thickness of the printed circuit board substrate 124 may be in the range of approximately 0.3 millimeter to approximately 4.0 millimeters.

Furthermore, the stator winding monitoring system 100 may include an alternating current (AC) source (not shown in figure) to power the sensor 102. In one embodiment, the AC source may be a low voltage and high frequency current source and may be connected to the conductive sensor antenna 122 through an electrical feed 128. The conductive sensor antenna 122 powered by the AC source may transmit electromagnetic waves towards the stator bars 106 creating the electromagnetic field around the conductive sensor antenna 122. Variations in the electromagnetic field caused by movement of the stator winding may result in a load on the conductive sensor antenna 122. The load may be received and measured by a signal processing unit 130 in serial communication with the conductive sensor antenna 122. In one example embodiment of the invention, the AC power source may be integrated with the signal processing unit 130. The load measured and processed in the signal processing unit 130 may generate vibration data in the form of impedance change. The impedance change or vibration data is then subsequently fed to a controller 132 in serial communication with the signal processing unit 130. However, in one example embodiment of the invention, the signal processing unit 130 may be integrated with the controller 132. In a further embodiment of the invention, the sensor 102 may consist of an array of conductive sensor antenna 122 etched, deposited, or otherwise affixed to the printed circuit board substrate 124. In yet another embodiment, the sensor 102 may consist of multiple arrays of conductive sensor antenna 102 etched, deposited, or otherwise affixed to the printed circuit board substrate 124, thus forming a grid of antennas. The increase in the number of conductive sensor antennas 122 forming the sensor 102 may increase the linear range of the sensor 102. However, in addition to increasing the linear range of the sensor 102, the sensitivity of the sensor 102 may be increased by allowing for a suitable geometry of the sensor 102. The conductive sensor antenna 122 may be formed as various shapes on the printed circuit board substrate 124.

FIG. 2 illustrates an example sensor 200, in accordance with an embodiment of the invention. In one example embodiment shown in FIG. 2, a sensor 200 includes a conductive sensor antenna 202 formed in the shape of an elliptical coil on one side of a printed circuit board substrate 204. The opposing side of the printed circuit board substrate 204 may be mounted with a non-conductive shield to limit the electromagnetic field produced by the conductive sensor antenna 202 on the opposite direction of the printed circuit board substrate 204. In addition to geometry, the sensitivity of the sensor antenna 202 illustrated in FIG. 2 may also be governed by the number of turns of the elliptical coil. However, in some example embodiments, the number of turns may formed on the printed circuit board substrate 204 may reach a given maximum, depending upon the size limitations of the sensor 200. In these embodiments, an increase in the number of turns may be accomplished by providing additional layers of the printed circuit board substrate 204 on which sensor antenna 202 may be formed.

FIG. 3 illustrates an example sensor 300, in accordance with an embodiment of the invention. FIG. 3 illustrates an example embodiment of the sensor 300 with a conductive sensor antenna 302 in the form of elliptically shaped coils etched, deposited, or otherwise affixed to three layers: a first layer 304a, a second layer 304b, and a third layer 304c of a printed circuit board substrate 304, for example. The elliptical coils etched, deposited, or otherwise affixed to the different layers 304a, 304b and 304c of the printed circuit board substrate 304 may be connected together through a via, through electromagnetic coupling, or any other suitable technique as is known. Thus the sensor antenna 302 may effectively be helical elliptical in shape. Multiple layers of the printed circuit board substrate 304 accommodate a larger number of turns of the elliptical coil and thus, increasing the sensitivity of the sensor 300. In a further embodiment of the invention, each of the different layers 304a, 304b, and 304c of the printed circuit substrate 304 may be rigid or flexible. In an example embodiment, winding or current direction of the elliptical coils in the layers 304a, 304b and 304e alternate between two layers. For example, in the first layer 304a, the winding or current direction is from outside to inside, while the second layer 302b which is connected to the first layer 302a by a via has winding or current direction from inside to outside, and so on.

In one embodiment of the invention, the sensor 300 may be placed against the wedges 116, and may thus be positioned between the stator core 104 and rotor. The position of the sensor 300 may be such that a first side of the first layer 304a of the printed circuit board substrate 304 may substantially face the stator bars 106, while an opposing side of the third layer 304c may substantially face away from the stator bars 106 and towards a rotor. In order to limit the electromagnetic field produced by the sensor antenna 302 in the direction of the rotor, a non-conductive shield 306 may be mounted on the printed circuit board substrate 304 as a fourth layer. This is termed as 'back loading' the sensor 300. The process of back loading the sensor 300 involves inserting the fourth layer 306 of the printed circuit board substrate 304 with steel or ferrite and subsequent threading of the steel or the ferrite to form the non-conductive shield 306. The amount of iron or ferrite inserted may be such that the electromagnetic field produced by the sensor antenna 302 is substantially cancelled out.

FIG. 4 illustrates an example sensor 400, in accordance with one embodiment of the invention. FIG. 4 provides a view of the sensor 400 with a conductive patch antenna 402 etched, deposited, or otherwise affixed to one side of a printed circuit board substrate 404. The functionality and operation of the sensor 400 illustrated in FIG. 4 is similar to that of the sensor 300 described in conjunction with FIG. 3. In the example embodiment shown in FIG. 4, the sensor 400 uses a conductive patch antenna 402 etched, deposited, or otherwise affixed to on a printed circuit board substrate 404. The shape and the geometry of the conductive patch antenna 402 may be such that the electromagnetic field produced around the sensor 400 is narrower and taller as compared to the field produced by the elliptical coil in the sensor 300. Further, the conductive patch antenna 402 may be positioned in the sensor 400 such that the electromagnetic magnetic field produced by the conductive patch antenna 402 does not affect the stator iron but is solely directed towards and affects only the stator winding. Thus, through the proper positioning/orientation of the conductive patch antenna 402, the sensor 400 is prevented from loading or otherwise affecting the electromagnetic field by the stator iron that surrounds the stator windings. Since, the electromagnetic field generated by the conductive patch antenna 402 is directional in nature there it is not necessary to back load any layer of the printed circuit board substrate 404 in this example. Thus, when placed between the stator and a rotor of a rotating machine during operation, the opposing side of the sensor 400 facing away from the stator is automatically shielded from the effect of the rotor. Along with the directional nature of the emitted electromagnetic waves, the shape and geometry of the conductive patch antenna may also govern the operating frequency range of the sensor antenna.

FIG. 5 illustrates example sensor antenna shapes, in accordance with embodiments of the invention. FIG. 5 provides a view of different shapes of patch antennas 500, 502 and 504. FIG. 5 shows a rectangular patch antenna 500 with overhangs defined by Yo and Xo, a rhomboid shaped conductive patch antenna 502, and a circular shaped conductive patch antenna 504. It is appreciated that patch antennas 500, 502, and 504 are for illustrative purposes only, and that other patch sensor configurations may be provided depending upon the desired characteristics and other design constraints. In an embodiment of the invention, the different geometries of the conductive patch antennas 500, 502 and 504 may be governed by the desired operating frequency or the range of operating frequencies of the sensor (not shown in figure). Patch antennas with larger surface areas have a lower operating frequency while patch antennas with smaller surface areas have higher operating frequencies. Thus, the geometric parameters of length (L), width (W) or radius (R) of the different patch antennas 500, 502 and 504 govern the operating frequency range of the sensor, while the trace width ($w_0$) defined as the distance between two parallel feeds to the sensor governs input impedance of the patch antennas 500, 502 and 504. Since the input impedance of the sensor may be changed using the trace width ($w_0$) of the patch antennas, the sensor may be tuned to obtain impedance matching. Impedance matching in the sensor may be useful to maximize power utilization and thus minimize losses in the sensor.

In an embodiment of the invention, the sensor may have an array of conductive patch antennas with a series feed. Since the series feed introduces delay into the patch antenna array, the trace width ($w_0$) may be used to change the impedance of individual conductive patch antennas such that there is no delay in the array and all the individual patch antennas in the array are tuned.

In another embodiment of the invention, the electromagnetic waves emitted by the conductive patch antennas forming the patch antenna array may be polarized. Polarization of the emitted electromagnetic waves may provide for minimum losses while receiving the electromagnetic waves and avoid noise in the received electromagnetic waves. In an embodiment of the invention, the emitting electromagnetic waves may be linearly polarized or circularly polarized. The use of one conductive patch antenna geometry over the other in a sensor may depend on the nature of metal to be detected, which may or may not change the plane of polarization of the incident electromagnetic waves from the sensor.

Typically the radiation polarization of a rectangular patch antenna is linear, such as in a vertical direction and/or a horizontal direction. However, in one example embodiment, a patch antenna 500, 502, 504 may include a slot, as illustrated in FIG. 5. The slot has the effect of making the radiation of the antenna circularly or substantially circularly polarized. For proximity measurements, circular polarization may ease the creation of the eddy current in the target metal as compared to linear polarization. Slots can also help simplify the antenna array design by not requiring two feeds into a single patch that needs circular polarization. It is appreciated that, although FIG. 5 illustrates slots in the patch antenna 500, 502, 504, other embodiments may be solid and do not include a slot. Moreover, although the slots are illustrated as rectangular in shape, other shaped slots may be employed.

FIG. 6 illustrates an example sensor 600, in accordance with an embodiment of the invention. FIG. 6 shows the sensor 600 with a plurality of patch antenna arrays 602a and 602b on one side of a printed circuit board substrate 604. In the example embodiment illustrated in FIG. 6, the sensor 600 comprises a grid of conductive patch antennas. The use of the grid increases the linear range of the sensor 600 and creates a narrower and more focused electromagnetic field. In the example embodiment shown in FIG. 6, the patch antenna arrays 602a and 602b may be provided with power through a plurality of series feeds 606. The series feeds 606 introduce delay into the individual patch antennas forming the patch antenna arrays 602a and 602b. The delay introduced into the individual patch antennas may require tuning for better efficiency of the sensor 600. Tuning the patch antenna arrays 602a and 602b may provide individual patch antennas that may emit and receive electromagnetic waves in same phase. Tuning the sensor 600 may also provide a cumulative effect of the individual patch antennas in the grid, providing an increased linear range of the sensor 600. Thus, when tuning the sensor 600 to remove the delay in the individual patch antennas, delay elements are suitably introduced and/or adjusted in the individual patch antennas to nullify any overall delay of the sensor 600. In an example embodiment, the sensor 600 may be tuned by additionally adjusting the feed length of the individual sensor antennas forming the array 602a and/or 602b. The different path lengths to the individual sensor antennas may be accordingly adjusted to cancel out the overall delay in the sensor 600. In a further embodiment of the invention, trace width ($w_0$) of the individual patch antennas may be suitably adjusted to nullify the overall delay of the sensor 600. In another embodiment of the invention, resistive (R), inductive (L), and capacitive (C) elements may be suitably introduced and/or adjusted in the individual patch antennas to nullify the overall delay of the sensor 600. In one embodiment of the invention, the signal processing unit and the controller may be replaced by a proximeter, which may perform at least part of the tuning of the sensor 600.

In another example embodiment of the invention, the sensor 600 may not involve tuning to limit or remove delay. The individual sensor antennas forming the arrays 602a and 602b may be designed to have delays to force an interference pattern or a phase shifting in the driving signals. In some examples, it may be desirable to create a tall and/or narrow field within an acceptable linear range of the sensor 600 as a result of delays within the sensor 600. Delays in the sensor arrays may be designed/altered as desired by adjusting the length of the feeds or by suitably introducing resistive (R), inductive (L), and capacitive (C) elements in the individual patch antennas.

In an embodiment of the invention, the patch antennas in an array may be provided power through a corporate feed. The use of the corporate feed ensures that there are no delays in the power supply to the individual conductive patch antennas. Thus, the arrangement results in a self tuned system and does not require the use of any delay elements for correcting the delay in the individual conductive patch antennas.

FIG. 7 illustrates a functional view of an example stator winding monitoring system 700, in accordance with an embodiment of the invention. FIG. 7 illustrates one example embodiment in which a plurality of sensors 702a, 702b and 702c may be placed at different points on stator bars 106, as described with reference to FIG. 1. The plurality of sensors 702a, 702b and 702c may include at least one sensor antenna as described in more detail with reference to FIGS. 2-6, for example. FIG. 7 shows a stator core 706 containing stator bars 106 pressed against wedges 116. The sensors 702a, 702b and 702c may be placed on the surface of the wedges 116. The sensors 702a, 702b and 702c may be powered by an alternating current (AC) power source (not shown in figure) through the electric feed 128. The signal processing unit 130 in electrical communication with the sensors 702a, 702b and 702c may measure a load resulting from the variations in the electromagnetic field caused by movement of the stator winding in each of the sensors 702a, 702b and 702c. The load measured is subsequently processed in the signal processing unit 130 and vibration data is generated. The generated vibration data is subsequently fed to the controller 132 in serial communication with the signal processing unit 130. In an embodiment, the signal processing unit 130 and the controller 132 may be replaced by a proximeter. The relative position of the sensors 702a, 702b and 702c govern the interference between the electromagnetic fields of the sensors. Thus, the relative positioning of the sensors 702a, 702b and 702c may be accordingly adjusted to obtain a desired increase in linear range along with a narrow and more focused electromagnetic field.

In an embodiment of the invention, the sensors 702a, 702b and 702c are each connected to a different proximeter. The geometry and positioning of the sensors 702a, 702b and 702c is governed by the desired electromagnetic field. In an embodiment of the invention, the sensors 702a, 702b and 702c may be used for mapping the stator winding vibration at multiple points of the stator bars 106 and may use orthogonal operating frequencies. Mapping at multiple points of the stator bars 106 allows for a three dimensional monitoring of the stator winding vibration.

FIG. 8 is a flowchart illustrating an example method 800 for monitoring stator winding vibration. In the embodiment shown, the example method 800 can be implemented to monitor stator winding vibration using conductive antennas etched, deposited, or otherwise affixed to a printed circuit board substrate.

The example method begins at block 802. At block 802, a first sensor is provided that includes at least one conductive sensor antenna substantially deposited on a first side of a printed circuit board substrate, as is described with reference to FIGS. 2-6. For example, in one embodiment of the invention, the sensor antenna may include at least one conductive elliptical coil. The conductive elliptical coil may consist of a plurality of turns where the coil may be etched, deposited, or otherwise affixed to multiple layers of the printed circuit board substrate. In another example embodiment of the invention, the sensor antenna may include at least one conductive patch antenna. In yet another embodiment, the sensor antenna may include a plurality of conductive patch antennas. In another further embodiment, the sensor may include a plurality of sensors, where each sensor may be positioned at a respective point along the stator winding. The plurality of sensors may be used to measure the vibration at different points of the stator bars. The different sensors may use different orthogonal frequencies which do not interfere with each other.

Following block 802 is block 804, in which a non-conductive shield is mounted to the side of the printed circuit board substrate opposite the side on which the antenna is/are formed to provide back loading. In one embodiment, the non-conductive shield may be mounted during the manufacturing of the sensor, such as at or near the same time as depositing or otherwise affixing the antenna to the substrate. In another embodiment, however, the non-conductive shield may be mounted at some point after manufacturing the sensor. The opposing face of the printed circuit board substrate may be inserted with steel or ferrite and may be subsequently threaded. The amount of iron or ferrite inserted may be such that the electromagnetic field produced by the sensor antenna on the opposing face of the printed circuit board substrate disappears.

Following block 804 is block 806, in which at least a portion of the sensor is positioned along a stator winding where the first side of the printed circuit board substrate faces substantially towards the stator winding and the opposing side faces substantially away from the stator winding, orienting the sensor antenna against the stator winding and the non-conductive shield facing the rotor. The stator winding may include a stator bar, a ripple spring positioned against a bottom edge of the stator bar, and a wedge positioned against the ripple spring. Thus, the sensor may be positioned on the stator bar against the wedge, with the first side of the printed circuit board substrate pressed against the wedge and facing substantially towards the stator winding and the opposing side facing substantially away from the stator winding.

Following block 806 is block 808, in which alternating current is delivered from an alternating current power source to the at least one sensor antenna. The alternating current power source may be a low voltage and high frequency current source. The alternating current power source may be connected to the conductive sensor antenna through an electrical feed.

Following block 808 is block 810, in which a measurement of a load on at least one sensor antenna may be received by a signal processing unit, wherein the load is affected by variations in an electromagnetic field caused by movement of the stator winding. The conductive sensor antenna powered by an alternating current power source through an electrical feed transmits electromagnetic waves creating an electromagnetic field around the sensor antenna. The vibrations in the stator winding may bring about a change in the strength of the electromagnetic field around the sensor antenna. The change in the strength of the electromagnetic field may result in a change in inductance thus giving rise to a measurable load on the sensor antenna. The load may be received by a signal processing unit in serial communication with the sensor antenna.

Following block 810 is block 812, in which the vibration data is transmitted to a controller from the signal processing unit responsive to the load on the at least one sensor antenna.

The signal processing unit receiving the load on the at least one sensor antenna generates vibration data. The vibration data generated by the signal processing unit may be fed to a controller in serial communication with the signal processing unit.

According to various example embodiments of the invention, the controller may be any processor based device operable to receive signals and to transmit and/or perform operations on those signals. For example, a controller may be any programmable logic controller ("PLC"), such as a general purpose computer, a server computer system, a mainframe computer, a signal processing device, a monitoring device, and the like. In addition, in one embodiment, the controller may be integrated with the signal processing unit. While the invention has been described in connection with what is presently considered to be the most practical and various embodiments, it is to be understood that the invention is not to be limited to the disclosed embodiments, but on the contrary, is intended to cover various modifications and equivalent arrangements included within the spirit of the appended claims.

This written description uses examples to disclose the invention, including the best mode, and also to enable any person skilled in the art to practice the invention, including making and using any devices or systems and performing any incorporated methods. The patentable scope the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The claimed invention is:

1. A system for monitoring a stator winding, comprising: at least one sensor comprising:
    at least one actively powered conductive sensor antenna deposited on a first side of at least one layer of a printed circuit board substrate, wherein at least a portion of the at least one antenna is positioned to substantially face a stator winding, and
    a non-conductive shield mounted to an opposing side of the at least one layer of the printed circuit board substrate, wherein at least a portion of the shield is positioned to substantially face away from the stator winding;
    at least one alternating current power source in communication with the at least one sensor and operable to deliver current to the at least one sensor antenna; and at least one signal processing unit in communication with the at least one sensor and operable to measure a load on the at least one sensor antenna and transmit vibration data to a controller responsive to the load on the at least one sensor antenna.

2. The system of claim 1, wherein the at least one sensor antenna comprises at least one conductive elliptical coil.

3. The system of claim 2, wherein the at least one elliptical coil comprises a plurality of turns, and wherein each turn is deposited in an individual layer of a plurality of layers of the printed circuit board substrate to form a substantially helical elliptical coil.

4. The system of claim 1, wherein the printed circuit board substrate comprises one of a substantially rigid printed circuit board substrate or a flexible printed circuit board substrate.

5. The system of claim 1, wherein the at least one sensor antenna comprises at least one conductive patch antenna.

6. The system of claim 1, wherein the at least one sensor antenna comprises a patch antenna array comprising a plurality of patch antennas.

7. The system of claim 1, wherein the at least one sensor antenna comprises a plurality of patch antenna arrays, each patch antenna array comprising a plurality of patch antennas.

8. The system of claim 1, wherein the stator winding comprises at least one stator bar, at least one ripple spring positioned against a bottom edge of the stator bar, and at least one wedge positioned against the at least one ripple spring, and wherein at least a portion of the at least one sensor is positioned against the at least one wedge.

9. The system of claim 1, wherein the at least one sensor comprises a plurality of sensors, each sensor positioned at a respective point along the stator winding.

10. The system of claim 1, wherein the at least one sensor comprises a plurality of sensor antennas, and wherein the at least one sensor is positioned to place each of the sensor antennas at a respective point along the stator winding.

11. The system of claim 1, wherein the printed circuit board substrate comprises a thickness of approximately 0.3 millimeters to approximately 4.0 millimeters.

12. A method for monitoring a stator winding, comprising:
providing at least one actively powered sensor comprising at least one conductive sensor antenna substantially deposited on a first side of at least one layer of a printed circuit board substrate;
providing a non-conductive shield mounted to an opposing side of the least one layer of the printed circuit board substrate;
positioning at least a portion of the at least one sensor along a stator winding, wherein the first side of the printed circuit board substrate faces substantially towards the stator winding and the opposing side faces substantially away from the stator winding;
delivering alternating current from an alternating current power source to the at least one sensor antenna;
receiving a measurement of a load on at least one sensor antenna by a signal processing unit, wherein the load is affected by variations in an electromagnetic field caused by movement of the stator winding; and
transmitting vibration data to a controller from the signal processing unit responsive to the load on the at least one sensor antenna.

13. The method of claim 12, wherein the at least one sensor antenna comprises at least one conductive elliptical coil.

14. The method of claim 13, wherein the at least one elliptical coil comprises a plurality of turns, and wherein each turn is deposited in an individual layer of a plurality of layers of the printed circuit board substrate.

15. The method of claim 12, wherein the at least one sensor antenna comprises at least one conductive patch antenna.

16. The method of claim 12, wherein the at least one sensor antenna comprises a plurality of conductive patch antennas.

17. The method of claim 12, wherein the stator winding comprises at least one stator bar, at least one ripple spring positioned against a bottom edge of the stator bar, and at least one wedge positioned against the at least one ripple spring, and wherein positioning at least a portion of the at least one sensor along the stator winding comprises positioning at least a portion of the at least one sensor against the at least one wedge.

18. The method of claim 12, wherein providing the at least one sensor comprises providing a plurality of sensors, each positioned at a respective point along the stator winding.

19. The method of claim 12, wherein providing the at least one sensor comprises providing the at least one sensor comprising a plurality of sensor antennas, and wherein the at least one sensor is positioned to place each of the sensor antennas at a respective point along the stator winding.

20. An apparatus for monitoring a stator winding, comprising:
a printed circuit board substrate comprising a first side and an opposing side, wherein the first side is positionable against a stator winding;
at least one actively powered conductive sensor antenna deposited on the first side of the printed circuit board substrate;
at least one electrical feed in electrical communication with the at least one conductive sensor antenna and operable to connect to a power source and a signal processing unit; and
at least one non-conductive shield mounted to the opposing side of the printed circuit board substrate;
wherein the power source is operable to deliver current through the at least one electrical feed to the at least one sensor antenna; and
wherein the signal processing unit is operable to measure a load on the at least one sensor antenna affected by variations in an electromagnetic field caused by movement of the stator winding, and to transmit vibration data to a controller responsive to the load on the at least one sensor antenna.

* * * * *

UNITED STATES PATENT AND TRADEMARK OFFICE
CERTIFICATE OF CORRECTION

PATENT NO. : 8,812,254 B2
APPLICATION NO. : 12/388088
DATED : August 19, 2014
INVENTOR(S) : Boris Leonid Sheikman et al.

Page 1 of 1

It is certified that error appears in the above-identified patent and that said Letters Patent is hereby corrected as shown below:

In the Specification

Column 5, Line 42, please delete "304e" and insert therefor --304c--.

Signed and Sealed this
Seventh Day of April, 2015

Michelle K. Lee
*Director of the United States Patent and Trademark Office*